United States Patent [19]

Kucharewski

[11] 4,185,211

[45] Jan. 22, 1980

[54] ELECTRICAL CIRCUITS

[75] Inventor: Nicholas Kucharewski, Lebanon, N.J.

[73] Assignee: RCA Corporation, New York, N.Y.

[21] Appl. No.: 868,229

[22] Filed: Jan. 9, 1978

[51] Int. Cl.² .......................... H03K 5/18; H03F 3/45
[52] U.S. Cl. ..................................... 307/351; 307/353;
307/359; 330/253; 330/257
[58] Field of Search ............... 307/351, 352, 353, 355,
307/359, 360; 328/151; 330/252, 253, 255, 257, 260

[56] References Cited

U.S. PATENT DOCUMENTS

| | | | |
|---|---|---|---|
| 3,435,365 | 3/1969 | Greeson, Jr. | 330/260 |
| 3,469,112 | 9/1969 | Hands et al. | 330/253 X |
| 3,609,397 | 9/1971 | Zaman | 307/351 |
| 3,651,342 | 3/1972 | Dingwall | 307/205 X |
| 3,702,942 | 11/1972 | Aguirre | 307/352 |
| 3,857,047 | 12/1974 | Knight | 307/231 |
| 3,898,576 | 8/1975 | Fukaya | 330/253 X |
| 3,904,988 | 9/1975 | Hsiao | 307/359 X |
| 4,055,774 | 10/1977 | Ahmed | 307/296 R |
| 4,068,184 | 1/1978 | Ahmed | 330/257 |

OTHER PUBLICATIONS

Yang et al., "Peak Voltage Detector", *IBM Tech. Discl. Bull.*, vol. 6, No. 4, pp. 114–115, 9/1963.
Ahmed, "Zero-Offset Potential Follower Circuits", *RCA Technical Notes* (pub.), TN No. 938, 7 pp. Sep. 17, 1963.

*Primary Examiner*—Larry N. Anagnos
*Attorney, Agent, or Firm*—P. J. Rasmussen; A. L. Limberg; A. J. Jacobson

[57] ABSTRACT

A differential-input differential-output transconductance amplifier is connected so the potential applied to a first of its input terminals, its envelope, or portions of its envelope, is followed by the potential at the second of its input terminals, either continuously or at selected times. To this end the balanced variations in the output currents of the transconductance amplifier are converted to a single-ended signal applied to the input electrode of transistor means, the output electrode of which is connected to the second input terminal of the transconductance amplifier for completing a direct-coupled feedback loop. Modifications of the basic circuit provide potential followers, voltage amplifiers, peak detectors, envelope detectors, and sample-and-hold circuits.

12 Claims, 6 Drawing Figures

ELECTRICAL CIRCUITS

The present invention is embodied in electrical circuits of the following type. A differential-input, differential-output transconductance amplifier is connected so the potential applied to a first of its input terminals, its envelope, or portions of its envelope, is followed by the potential at the second of its input terminals, either continuously or at selected times. To this end the balanced variations in the output currents of the transconductance amplifier are converted by balanced-to-single-ended signal converter means to a single-ended signal applied to the input electrode of transistor means, the output electrode of which is connected to the second input terminal of the transconductance amplifier for completing a direct-coupled degenerative feedback loop.

In the drawing, each figure of which is a schematic diagram of apparatus embodying the present invention:

Figure 1:
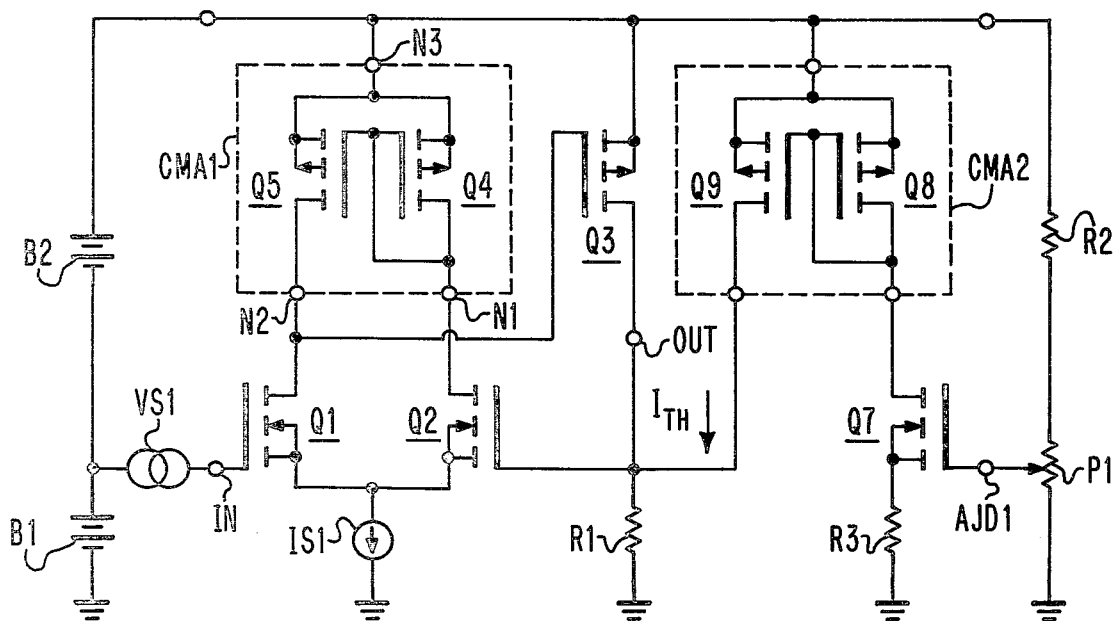
FIGS. 1, 2 and 3 show a potential follower, a voltage amplifier, and an amplitude detector built around the same basic configuration, which is constructed using field effect transistors (FET's)

In FIG. 1 n-channel FET's Q1 and Q2 are connected in long-tailed pair configuration for providing a differential-input, differential-output transconductance amplifier. Their interconnected source electrodes have tail current extracted from them by a current source IS1. IS1 may be a constant current generator, as provided at the drain electrode of another n-channel FET with fixed source-to-gate potential, or may simply consist of a resistor to ground or negative potential. A source of input signal potential VS1 is connected to apply input signal potential via an input terminal IN at the gate electrode of Q1, and a d-c voltage supply B1 biases the input signal potential to a positive quiescent voltage. The balanced drain current variations of Q1 and Q2 are converted to single-ended form by a current mirror amplifier CMA1. The resulting single-ended current variations affect the charge and, consequently, the voltage at the gate potential of a p-channel FET Q3. Q3 is connected in common-source amplifier configuration with its source electrode supplied a positive operating potential by the serially connected voltage supplies B1 and B2. An output terminal OUT, to which the drain electrode of Q3 connects, is also connected to the gate electrode of Q2 to complete a degenerative feedback connection that tends to adjust the gate potential of Q2 to equal that of Q1, and a resistive element R1 connects the terminal OUT to ground thereby providing a drain load for Q3.

More particularly, current mirror amplifier CMA1 has input and output connections to the drain electrodes of Q2 and Q1 respectively at nodes N1 and N2 respectively and has a common connection at node N3 supplied a positive operating potential by the serially connected voltage supplies B1 and B2. CMA1 may, as shown, be of the type comprising p-channel FET's Q4 and Q5 having their respective drain electrodes connected to the input and output connections of CMA1 at nodes N1 and N2 respectively, having their respective source electrodes interconnected at the common connection of CMA1—i.e., to node N3—and having their respective gate electrodes interconnected to receive charge from the input connection of CMA1 at node N1. Drain current $I_{DQ2}$ from Q2 tends to increase the charge between node N3 at the interconnection of the source electrodes of Q4 and Q5 and node N1 at the interconnection of their gate electrodes, responsive to which the respective source-to-gate potentials $V_{GSQ4}$ and $V_{GSQ5}$ of Q4 and Q5 tend to be increased and in turn their respective drain currents $I_{DQ4}$ and $I_{DQ5}$. This tendency continues without check until $I_{DQ4}$ becomes as large as the drain current $I_{DQ2}$, which halts the increase in negative charge between nodes N3 and N1 and the resultant increase in $V_{GSQ4}$ and $V_{GSQ5}$ and in $I_{DQ4}$ and $I_{DQ5}$. Change in $I_{DQ2}$ will require a corresponding change in $I_{DQ4}$ in order that the charge between nodes N3 and N1 maintains an equilibrium state. Since the $V_{GSQ5}$ is the same as $V_{GSQ4}$, $I_{DQ5}$ of Q5 will be in ratio to $I_{DQ4}$ of Q4 in the same ratio G as their tracking drain current versus source-to-gate potential ($I_D$-vs-$V_{GS}$) characteristics, as determined by their relative channel width-to-length ratios. This results in a current gain of $-G$ for CMA1 as between its input and output connections.

Normally these ratios are all 1:1 ratios, as are the ratios of the respective $I_D$-vs-$V_{GS}$ characteristics of Q1 and Q2 and their respective channel width-to-length ratios. That is, G is unity-valued. In such case the drain current of Q5 is equal to that of Q2 in amplitude, but is oppositely directed. G may, however, take on other positive values. In any case, if the $I_D$-vs-$V_{GS}$ characteristics of Q1 and Q2 are in the same ratio G as those of Q5 and Q4, so long as the gate potentials of Q1 and Q2 are equal, there will be no net current at node N2 to affect the charge between nodes N2 and N3 and thus to affect the source-to-gate potential $V_{GSQ3}$ of Q3.

Should the input signal voltage from VS1 applied via terminal IN as gate potential Q1 become more positive than the gate potential applied to Q2, Q1 and Q2 will be biased for increased and decreased conduction respectively. Increased $I_{DQ1}$ will become larger than $I_{DQ5}$ which being proportional to $I_{DQ1}$ is decreased in like proportion as $I_{DQ2}$. The net current flow out of node N2 requires the capacitance between nodes N3 and N2 to be charged, increasing $V_{GSQ3}$ and consequently the drain current $I_{DQ3}$ of Q3. The increased $I_{DQ3}$ flows through R1 to increase the potential drop thereacross sufficiently to raise the gate potential of Q2 to the same level as the gate potential of Q1, thereby to re-establish charge equilibrium at the gate electrode of Q3.

Conversely, should the input signal voltage from VS1 applied as gate potential to Q1 become more negative than the gate potential applied to Q2, Q1 and Q2 will be biased for decreased and increased conduction respectively. Decreased $I_{DQ1}$ will become smaller than $I_{DQ5}$ which, being proportional to $I_{DQ2}$, is increased in like proportion as $I_{DQ2}$. The net current flow into node N2 requires the capacitance between nodes N2 and N3 to be discharged, decreasing $V_{GSQ3}$ and consequently $I_{DQ3}$. The potential drop across R1 due to the flow of $I_{DQ3}$ therethrough is reduced in proportion to the decrease in $I_{DQ3}$, lowering the gate potential of Q2 to the same level as the gate potential of Q1, thereby to re-establish charge equilibrium at the gate electrode of Q3.

The operation as thus far described, which ignores the effects of a current $I_{TH}$, that may be coursed through R1, is that of a potential follower, the potential at terminal OUT following that at terminal IN with substantially zero-valued offset potential. This zero-valued offset potential comes about because of the gain-G of the amplifier used to differentially combine the drain currents of Q1 and Q2 being equal to the ratio of the $I_D$-vs-$V_{GS}$ characteristic of Q1 to that of Q2 for similar $V_{GS}$ values. The reason for zero-valued offset potential under these circumstances is that CMA1 differentially combines the drain currents of Q1 and Q2 to apply no error current to charge or discharge the gate electrode of Q3 when they have values that are associated with their source-to-gate potentials being equal, so the direct coupled feedback loop need not readjust $V_{GSQ2}$ from its being equal to $V_{GSQ1}$.

In certain applications it is desired that potential following obtains only over the more positive portions of input signal excursion. The conventional way to perform such a clipping function is to use the clamping properties of a unidirectionally conductive device such as p-n junction diode or the emitter-base junction of a bipolar transistor. Such devices are oftentimes unavailable to the designer of integrated circuits, particularly where the method of fabricating the integrated circuits is one primarily directed to constructing field effect devices; and self-biased FET's, because of the tendency towards relatively low transconductances in acceptably small sizes to facilitate integrated fabrication, tend not to have as good clamping properties as p-n junctions of similar size and thus are not well suited to applications requiring hard clipping.

By causing a current $I_{TH}$ to flow through R1 by circuit means other than that described in detail supra, the component of potential drop across R1 thus established defines a least positive gate potential for Q2 below which potential following at the gate electrode of Q2 will not take place. As VS1 reduces the gate potential of Q1 below this least positive value of Q2 gate potential, increase of $I_{DQ2}$ and decrease of $I_{DQ1}$ from their equilibrium values will result. $I_{DQ5}$ will attempt to increase proportionately to $I_{DQ2}$ and will exceed $I_{DQ1}$, discharging the capacitance between nodes N2 and N3 to reduce $V_{GSQ3}$ towards zero. Q5 experiences decreasing source-to-drain voltage, or $V_{DS}$, and node N2 is clamped to the positive operating voltage applied to node N3. With substantially zero $V_{GSQ3}$, Q3 supplies no $I_{DQ3}$ drain current and the potential drop across R1 is due solely to $I_{TH}$ to establish the least positive level of voltage at terminal OUT and gate potential at Q2. At input signal voltages more positive than this level, as described above, Q3 will be conditioned to conduct sufficiently to raise the gate potential of Q2 to equal that of Q1.

FIG. 1 shows a representative configuration for providing $I_{TH}$. A voltage divider comprising a resistive element R2 and a potentiometer P1 provides an adjustable fraction of the positive operating voltage provided by B1 and B2 to a terminal ADJ1 at the gate electrode of an n-channel FET Q7. This fraction of operating potential, less the source-to-gate offset potential $V_{GSQ7}$ of Q7 is the potential appearing across the source degeneration resistor R3 and determines the source current of Q7 in accordance with Ohm's Law. The drain current $I_{DQ7}$ of Q7, similarly valued to its source current, is withdrawn from the input connection of a current mirror amplifier CMA2, having its common connection to positive operating supply potential. $I_{TH}$ supplied from the output connection of CMA2 is proportionately related to $I_{DQ7}$ by the current gain of CMA2. In the type of current mirror amplifier CMA2 shown, comprising p-channel FET's Q8 and Q9, this current gain is determined by the relative channel width-to-length ratios of Q9 and Q8, analogously to the current gain of CMA1 being determined by the channel width-to-length ratios of Q5 and Q4.

One may desire to operate with the potentials at nodes N1 and N2 substantially equal, so the source-to-drain voltages of Q1 and Q2 are equal, making their $I_D$-vs-$V_{GS}$ characteristics track better, and so the source-to-drain voltages of Q4 and Q5 are equal, making their $I_D$-vs-$V_{GS}$ characteristics track better. This is easily accomplished by replacing R1 with a constant current generator that demands from terminal OUT a current consisting of a first component in proper proportion to IS1 and a second component equal to $I_{TH}$. Such a constant current generator might comprise, for example, n-channel FET's with source-to-gate circuits respectively parallelling that of Q7 and that of a fixed-bias n-channel FET used as IS1, for example.

Figure 2:
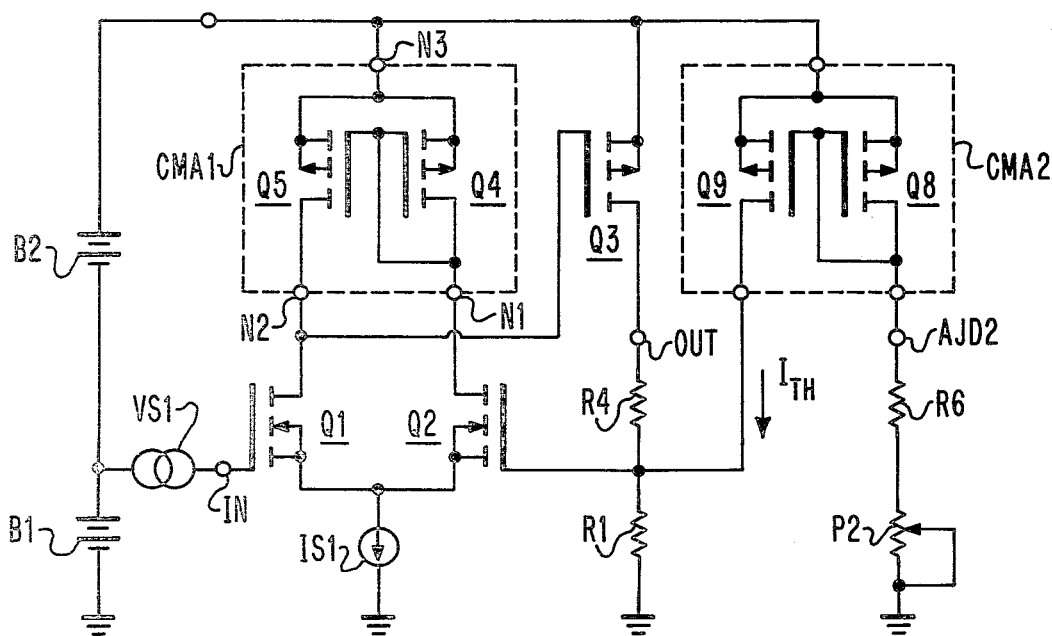

FIG. 2 shows the potential follower of FIG. 1 modified by inclusion of R4 to operate as a voltage amplifier and modified to simplify the circuitry for providing $I_{TH}$. Terminal ADJ2 at the input connection of CMA2 is connected by the serial combination of resistive element R6 and a rheostat to ground potential. The rheostat consists of a properly connected potentiometer P2, the adjustment of which causes the resistance of the rheostat to increase, decreasing $I_{TH}$, or to decrease, increasing $I_{TH}$. The voltage gain is $(R_4+R_1)/R_1$, where $R_1$ and $R_4$ are the resistances of resistive elements R1 and R4, for input signal voltages above $(I_{TH})(R_1)$. Alternatively, one may arrange for $I_{TH}$ to be $R_1/(R_1+R_4)$ times as large and applied directly to terminal OUT without affecting the voltage gain of the voltage amplifier.

Figure 3:
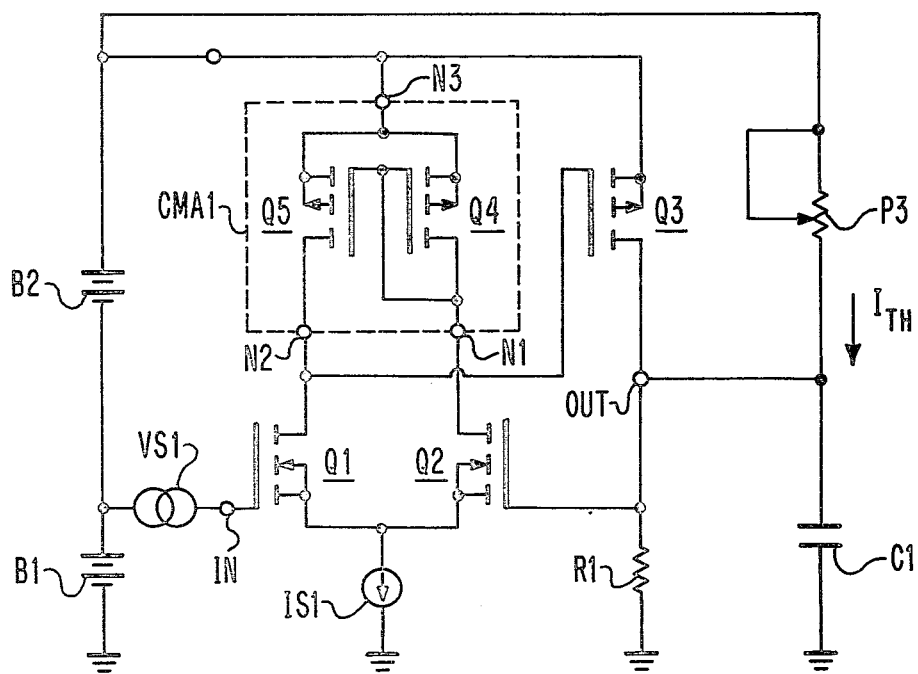

FIG. 3 shows the potential follower of FIG. 1 modified by inclusion of C1 to operate as an amplitude detector and modified to simplify the circuitry for providing $I_{TH}$ still further to a simple potentiometer P3 connected as a rheostat in resistive potential divider configuration with R1. If the time constant provided by R1, C1 is chosen long compared to the period of the carrier variations of input signal variations and short compared to its envelope variations, the circuit functions as an envelope detector. If, on the other hand, the time constant provided by R1, C1 is chosen long compared to the envelope variations as well, the circuit functions as a peak detector. It is the positive envelope or peaks of input signal potential which are detected in amplitude detectors of the sort shown in FIG. 3.

Figure 4:
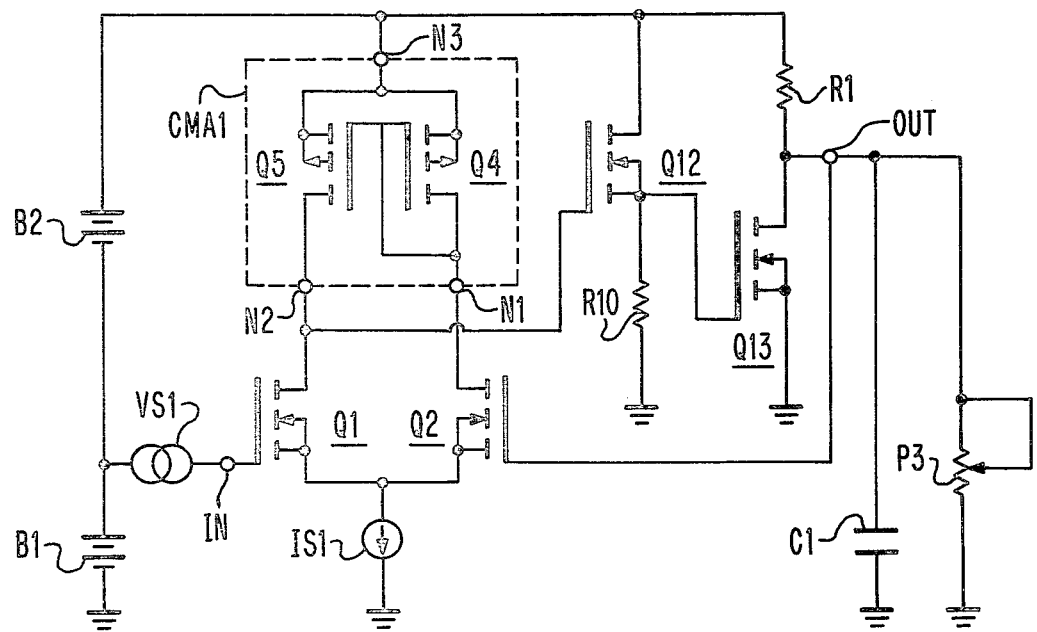
FIG. 4 shows a modification of that basic configuration used as an amplitude detector.

FIG. 4 shows how one may modify the amplitude detector to detect the negative envelope or peaks of input signal potential. Common-source amplifier transistor Q3 is replaced by a common-source amplifier transistor Q13 of similar rather than complementary conductivity type to Q1 and Q2, R1 and P3 being reversed in their connections to the operating supply provided by serially connected B1 and B2 to suit operation with n-channel FET Q13. Common-drain amplifier n-channel FET Q12 is a source follower that provides suitable voltage translation between node N2 and the gate electrode of Q13 to permit FET's Q1, Q2, Q4, Q5 and Q13 to operate at quiescent levels which permit their normal operation as transistors. Resistive element R10 pulls down the gate potential of Q13 towards ground as conduction through the channel of Q12 is reduced. Q12, R10 may be replaced by other voltage translating means, of course.

Figure 5:
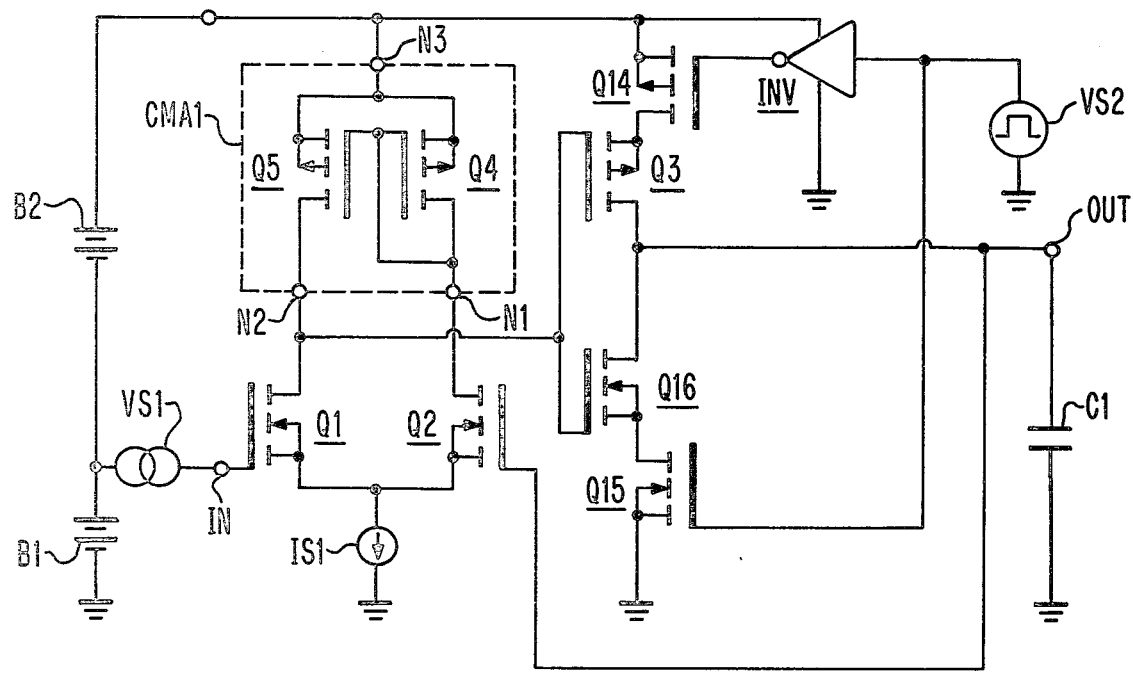
FIG. 5 shows a further modification of the basic configuration useful as a sample-and-hold circuit.

In the sample-and-hold circuit of FIG. 5 so long as the voltage from voltage source VS2 is "high"—i.e., at the positive operating potential supplied by serially connected supplies B1 and B2—p-channel FET Q14 and n-channel FET Q15 are both conductive. Q15 is conductive because the "high" voltage supplied by VS2 applied directly to its gate electrode biases its gate electrode positive with respect to its source electrode. Q14 is conductive because the "high" voltage from VS2 is applied to the input connection of an inverter INV, the output connection of which is to the gate of Q14 and applies a "low", ground potential to the gate of Q14. Q16 is biased so its channel provides a resistive means serving as a drain load for Q3; Q16 may be replaced by a resistive element connecting the terminal OUT to the drain of Q15. So long as the voltage from VS2 remains "high", the sample-and-hold circuit is in its sample mode, operating substantially like the FIG. 3 amplitude detector.

The potential at the terminal OUT is held whenever voltage source VS2 becomes "low", supplying a voltage at ground potential. The "low" voltage at the gate of Q15 biases it out of conduction. Inverter INV responds to the "low" voltage at its input connection to apply a "high" voltage at its output connection to the gate of Q14, biasing Q14 out of conduction. With Q14 and Q15 non-conductive there is no path for charge transfer between the terminal OUT and the nodes which receive the operating potentials afforded by B1 and B2. Since charge can neither flow to or flow from capacitor C1, supposing the capacitor to have reasonably low leakage resistance, terminal OUT remains at the potential it had at the beginning of the hold interval.

VS2 and INV may, of course, be replaced by more complex apparatus for more rigidly controlling the overlap of conduction of Q14 and Q15 in critical sample-and-hold applications. Alternative sample-and-hold configurations which embody the present invention, but in which the switched transistors are in the drain connections rather than the source connections of Q3 and Q15, are feasible, but generation of control signals for application to their gate electrodes is less straightforward than in the sample-and-hold circuit of FIG. 5.

Figure 6:
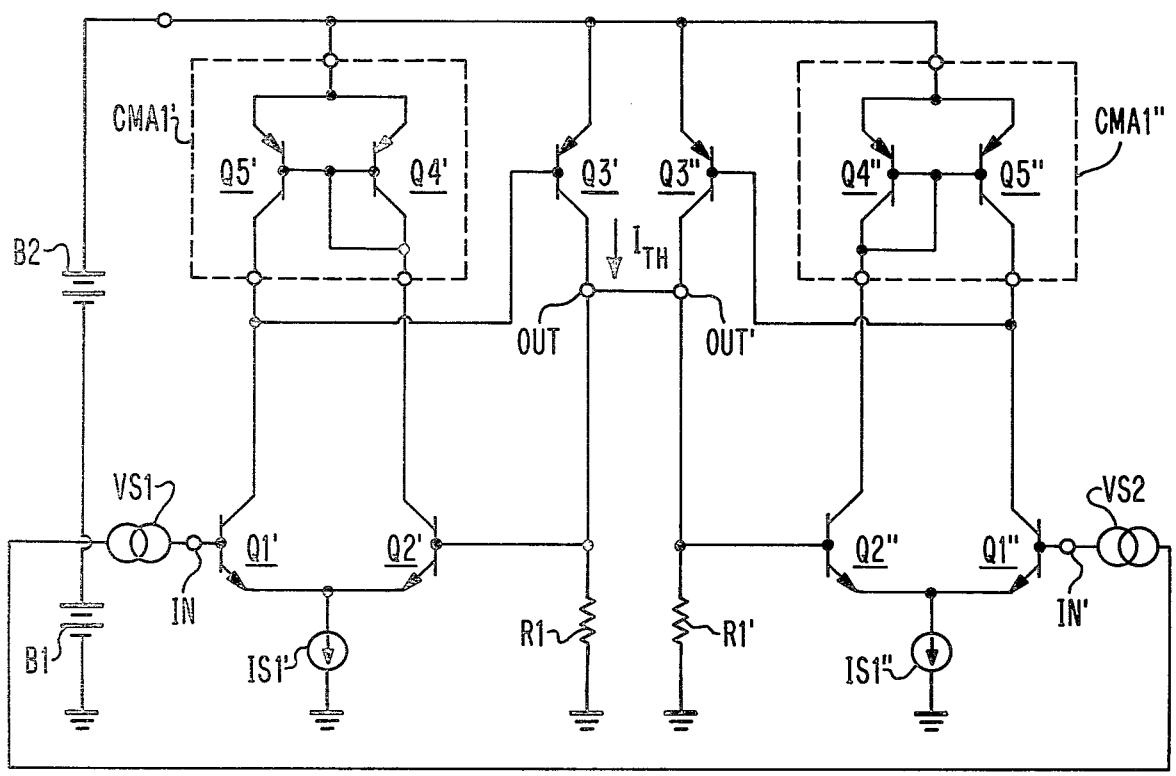
FIG. 6 shows a pair of the basic configurations constructed using bipolar transistors and connected for responding to the more positive of two input signal voltages.

FIG. 6 shows how the current identifiable as the $I_{TH}$ of a potential follower similar to that shown in FIG. 1 may derive from another similar potential follower. The potential followers differ from that of FIG. 1 in that their component transistors are bipolar rather than field effect in type. However, the bipolar transistors with singly primed reference numerals in the potential follower at left of FIG. 6 or doubly primed reference numerals in the potential follower at right of FIG. 6 function similarly to the FET's with similar but unprimed reference numerals in FIG. 1. CMA1' and CMA1" function similarly to CMA1; and IS1' and IS1", to IS1. Paralleled R1 and R1' may be replaced by a single resistor in practice, of course. The voltage at the interconnected output signal terminals OUT and OUT' of the potential followers will follow the more positive of the input signal voltages provided by voltage sources VS1 and VS2 at their respective input signal terminals IN and IN'. A larger-numbered plurality of potential followers as just described can be connected at their output signal terminals to provide an output signal corresponding to the most positive of the input signal potentials respectively applied to them.

One skilled in the art of electronic design and armed with the foregoing disclosure can construct other embodiments of the invention and the ensuing claims should be accordingly construed. For example, one may use bipolar or field effect transistors for Q1 and Q2; Q3; Q4 and Q5; Q7; Q8 and Q9; or Q1', Q2', Q1" and Q2" in constructing the embodiments of the invention shown in FIGS. 1–6.

What is claimed is:

1. In combination:

first, second and third transistors, each having first and second electrodes and a controlled conductivity principal current conduction path therebetween and having a third or control electrode, the conductivity of its principal current conduction path being controlled responsive to potential appearing between its first and third electrodes, said first and second and third transistors being of the same conductivity type as each other;

first and second power supply terminals for receiving an operating voltage therebetween;

an input terminal for signal at the third electrode of said first transistor and an output terminal for signal, means connecting said output terminal for signal to the third electrode of said second transistor;

means connecting said first and second transistors in long-tailed-pair configuration including an interconnection of their respective first electrodes and first direct current conductive means connected between that interconnection and said first power supply terminal;

a node to which the second electrode of said first transistor connects;

current amplifier means having an input connection from the second electrode of said second transistor and having an output connection to said node, for converting the balanced currents from the second electrodes of said first and second transistors to a single-ended current;

means connecting said third transistor in common-first-electrode amplifier configuration including a connection of the first electrode of said third transistor to said first power supply terminal, including means direct coupling said node to the third electrode of said third transistor, and including a connection of the second electrode of said third transistor to said output terminal; and second direct current conductive means connected between said second power supply terminal and said output terminal.

2. A combination as set forth in claim 1 wherein said first and second transistors are so proportioned respective to each other as to have the conductivities of their respective principal current conduction paths be in 1:G ratio with each other for similar first-to-third-electrode potentials and wherein the current gain of said current amplifier is −G, G being a positive number.

3. A combination as set forth in claim 1 wherein said means connecting said output terminal for signal to the third electrode of said second transistor consists of a direct connection of them without substantial intervening impedance.

4. A direct-coupled detector for the peaks or envelope of an input signal voltage comprising:

first, second and third transistors, each having first and second electrodes and a controlled conductivity principal current conduction path therebetween and having a third or control electrode, the conductivity of its principal current conduction path being controlled responsive to potential appearing between its first and third electrodes, said first and second and third transistors being of the same conductivity type as each other;

first and second power supply terminals for receiving an operating voltage therebetween;

an input terminal for signal at the third electrode of said first transistor and an output terminal for signal;

means connecting said output terminal for signal to the third electrode of said second transistor;

means connecting said first and second transistors in long-tailed-pair configuration including an interconnection of their respective first electrodes and first direct current conductive means connected between that interconnection and said first power supply terminal;

a node to which the second electrode of said first transistor connects;

current amplifier means having an input connection from the second electrode of said second transistor and having an output connection to said node, for converting the balanced currents from the second electrodes of said first and second transistors to a single-ended current;

means connecting said third transistor in common-first-electrode amplifier configuration including a connection of the first electrode of said third transistor to said first power supply terminal, including means connecting said node to the third electrode of said third transistor, and including a connection of the second electrode of said third transistor to said output terminal;

second direct current conductive means connected between said second power supply terminal and said output terminal; and a capacitor connected between said output terminal and a point of fixed potential respective to that at either of said first and second power supply terminals.

5. In combination:

first, second and third transistors, each having first and second electrodes and a controlled conductivity principal current conduction path therebetween and having a third or control electrode, the conductivity of its principal current conduction path being controlled responsive to potential appearing between its first and third electrodes, said first and second transistors being of the same conductivity type as each other and said third transistor being of an opposite conductivity type;

first and second power supply terminals for receiving an operating voltage therebetween;

an input terminal for signal at the third electrode of said first transistor and an output terminal for signal;

means connecting said output terminal for signal to the third electrode of said second transistor;

means connecting said first and second transistors in long-tailed-pair configuration including an interconnection of their respective first electrodes and first direct current conductive means connected between that interconnection and said first power supply terminal;

a node to which the second electrode of said first transistor connects;

current amplifier means having an input connection from the second electrode of said second transistor and having an output connection to said node, for converting the balanced currents from the second electrodes of said first and second transistors to a single-ended current;

means for connecting the first electrode of said third transistor to said second power supply terminal;

means connecting said node to the third electrode of said third transistor;

a connection of the second electrode of said third transistor to said output terminal;

a capacitor connected between said output terminal and a point of fixed potential respective to that at either of said first and second power supply terminals; and means for selectively enabling said third transistor to operate as a common-first-electrode amplifier, thereby conditioning said combination to function as a sample-and-hold circuit.

6. A combination as set forth in claim 5 wherein said means for selectively enabling said third transistor to operate as a common-first-electrode amplifier includes within said means for connecting the first electrode of said third transistor to said second power supply terminal a fourth transistor having between first and second electrodes thereof a controlled conductivity path serially connected with that of said third transistor and having a third, control electrode; and means for selectively applying a first control potential to the third electrode of said fourth transistor to condition its controlled conductivity path for high-conductivity current condition.

7. A combination as set forth in claim 6 having: current conducting means;

a fifth transistor having between first and second electrodes thereof a controlled conductivity path serially connected with said current conducting means between said output terminal for signal and said first power supply terminal and having a third control electrode; and means for selectively applying a second control potential, substantially simultaneously occurring with said first control potential, to the third electrode of said fifth transistor to condition its controlled conductivity path for relatively high-conductivity current conduction.

8. A combination as set forth in claim 5 wherein said means for selectively enabling said third transistor to operate as a common-first-electrode amplifier includes:

a fourth transistor of the same conductivity type as said third transistor, said fourth transistor having first and second electrodes respectively connected to said second power supply terminal and to the first electrode of said third transistor, having a third electrode, and having a controlled-conductivity principal current conduction path between its first and second electrodes the conductivity of which is controlled by the potential appearing between its first and third electrodes; and means for selectively applying a potential between the first and third electrodes of said fourth transistor to enable its otherwise disabled principal current conduction path.

9. A combination as set forth in claim 8 including:

fifth and sixth transistors of the same conductivity type as said first and second transistors, each having respective first and second and third electrodes and having a respective controlled-conductivity principal current conduction path between its respective first and second electrodes the conductivity of which path is controlled by the potential appearing between its first and third electrodes, the first electrodes of said fifth and sixth transistor respectively connected to the second electrode of said sixth transistor and to said first power supply terminal, the second electrode of said fifth transistor connected to said output terminal and its third electrode having direct coupled thereto said node to which the second electrode of said first transistor connects; and means for selectively applying a second control potential substantially simultaneously occurring with said first control potential, to the third electrode of said sixth transistor to condition its controlled conductivity path for relatively high-conductivity current conduction.

10. A direct-coupled detector for the peaks or envelope of an input signal voltage comprising:

first, second and third transistors, each having first and second electrodes and a controlled conductivity principal current conduction path therebetween and having a third or control electrode, the conductivity of its principal current conduction path being controlled responsive to potential appearing between its first and third electrodes, said first and second transistors being of the same conductivity type as each other and said third transistor being of an opposite conductivity type;

first and second power supply terminals for receiving an operating voltage therebetween;

an input terminal for signal at the third electrode of said first transistor and an output terminal for signal;

means connecting said output terminal for signal to the third electrode of said second transistor;

means connecting said first and second transistors in long-tailed-pair configuration including an interconnection of their respective first electrodes and first direct current conductive means connected between that interconnection and said first power supply terminal;

a node to which the second electrode of said first transistor connects;

current amplifier means having an input connection from the second electrode of said second transistor and having an output connection to said node, for converting the balanced currents from the second electrodes of said first and second transistors to a single-ended current;

means connecting said third transistor in common-first-electrode amplifier configuration including means for connecting the first electrode of said third transistor to said second power supply terminal, including means direct coupling said node to the third electrode of said third transistor, and including a connection of the second electrode of said third transistor to said output terminal; and p1 a capacitor connected between said output terminal and a point of fixed potential respective to that at either of said first and second power supply terminals.

11. In combination:

first, second and third transistors, each having first and second electrodes and a controlled conductivity principal current conduction path therebetween and having a third or control electrode, the conductivity of its principal current conduction path being controlled responsive to potential appearing between its first and third electrodes, said first and second transistors being of the same conductivity type as each other, an input terminal for signal at the third electrode of said first transistor and an output terminal for signal;

potential divider means connecting said output terminal for signal to the third electrode of said second transistor;

means connecting said first and second transistors in long-tailed-pair configuration including an interconnection of their respective first electrodes;

a node to which the second electrode of said first transistor connects;

current amplifier means having an input connection from the second electrode of said second transistor and having an output connection to said node, for converting the balanced currents from the second electrodes of said first and second transistors to a single-ended current; and means connecting said third transistor in common-first-electrode amplifier configuration including means direct coupling said node to the third electrode of said third transistor, and including a connection of the second electrode of said third transistor to said output terminal.

12. In combination:

first, second and third transistors, each having first and second electrodes and a controlled conductivity principal current conduction path therebetween and having a third or control electrode, the conductivity of its principal current conduction path being controlled responsive to potential appearing between its first and third electrodes, said first and second transistors being of the same conductivity type as each other;

an input terminal for signal at the third electrode of said first transistor and an output terminal for signal;

means connecting said output terminal for signal to the third electrode of said second transistor;

means connecting said first and second transistors in long-tailed-pair configuration including an interconnection of their respective first electrodes;

a node to which the second electrode of said first transistor connects;

current amplifier means having an input connection from the second electrode of said second transistor and having an output connection to said node, for converting the balanced currents from the second electrodes of said first and second transistors to a single-ended current;

means connecting said third transistor in common-first-electrode amplifier configuration including means direct coupling said node to the third electrode of said third transistor, and including a connection of the second electrode of said third transistor to said output terminal; and a constant current generator connected to said output terminal, said constant current generator being adjustable insofar as the amount of current flowing between it and said output terminal is concerned.

* * * * *

UNITED STATES PATENT AND TRADEMARK OFFICE
CERTIFICATE OF CORRECTION

PATENT NO. : 4185211
DATED : January 22, 1980
INVENTOR(S) : Nicholas Kucharewski It is certified that error appears in the above-identified patent and that said Letters Patent is hereby corrected as shown below:

In column 2, line 44, "$I_{DQ1}$" should read --$I_{DQ2}$--.

In column 9, line 59, delete "pl".

Signed and Sealed this

Twenty-seventh Day of May 1980

[SEAL]

Attest:

SIDNEY A. DIAMOND

Attesting Officer  Commissioner of Patents and Trademarks